United States Patent [19]
Rhodes

[11] Patent Number: 4,803,701
[45] Date of Patent: Feb. 7, 1989

[54] DIGITAL DETECTION CIRCUIT

[75] Inventor: Melvin H. Rhodes, Cedar Rapids, Iowa

[73] Assignee: The United States of America as represented by the Secretary of the Air Force, Washington, D.C.

[21] Appl. No.: 66,290

[22] Filed: Jun. 25, 1987

[51] Int. Cl.⁴ .............................. H03K 5/153
[52] U.S. Cl. .................... 375/102; 328/114; 455/304; 455/305
[58] Field of Search ............... 375/94, 95, 99, 102, 375/4; 455/303, 304, 309, 218, 223, 305; 307/517, 358; 329/145; 328/108, 109, 110, 114

[56] References Cited

U.S. PATENT DOCUMENTS

| | | | |
|---|---|---|---|
| 2,510,983 | 6/1950 | Krause | 375/102 |
| 2,695,359 | 11/1954 | Levy | 375/102 |
| 2,956,153 | 10/1960 | Farlow | 375/102 X |
| 3,076,145 | 1/1963 | Copeland et al. | 328/165 |
| 3,296,581 | 1/1967 | Warner | 375/102 X |
| 3,334,298 | 8/1967 | Monrad-Krohn | 328/114 |
| 3,617,900 | 11/1971 | Fink | 375/102 |
| 3,692,983 | 9/1972 | Cucciati et al. | 307/358 |
| 3,870,996 | 3/1975 | Miller | 455/305 |
| 3,922,611 | 11/1975 | Kanitz | 307/517 |
| 3,985,970 | 10/1976 | Lerault et al. | 375/4 |
| 4,032,847 | 6/1977 | Unkauf | 375/101 |
| 4,739,518 | 4/1988 | Bickley et al. | 455/305 |

Primary Examiner—Benedict V. Safourek
Attorney, Agent, or Firm—William Stepanishen; Donald J. Singer

[57] ABSTRACT

A digital pulse detection apparatus for correcting a distorted serial digital signal by differencing the signal and a delayed version of the signal in a differential amplifier to obtain the slope of the digital signal. The output signal from the differential amplifier is applied to a voltage hysteresis differential amplifier which provides the corrected digital output signal.

6 Claims, 3 Drawing Sheets

DIGITAL DETECTION CIRCUIT

STATEMENT OF GOVERNMENT INTEREST

The invention described herein may be manufactured and used by or for the Government for governmental purposes without the payment of any royalty thereon.

BACKGROUND OF THE INVENTION

The present invention is directed generally to signal detection circuits and in particular to a digital signal detection apparatus.

Many different methods have been used to recover a serial digital signal sent over long transmission lines where the transmission line causes a distortion of the signal. A long transmission line will cause a distortion of the digital signal when the transmission line's pulse response does not allow the signal transition to reach its final value between any two signal voltage transitions. This distortion changes the zero crossing relationships for the signal where zero is defined as the mean voltage between the voltage extremes or the average voltage for the received signal. If the zero crossing detector circuits are used to recover the received signal, the signal will have a timing jitter and some of the information can be lost or distorted if some of the zero crossing are lost.

In addition many of the generated digital waveforms have overshoot of the signal and the reflections which are generated by signal interaction which contain high frequency components.

The state of the art of detection circuits is well represented and alleviated to some degree by the prior art apparatus and approaches which are contained in the following U.S. Patents:

U.S. Pat. No. 2,510,983 issued to Krause on June 13, 1950;
U.S. Pat. No. 2,695,359 issued to Levy on Nov. 23, 1954;
U.S. Pat. No. 2,956,153 issued to Farlow on Oct. 11, 1960;
U.S. Pat. No. 3,076,145 issued to Copeland et al on Jan. 29, 1963;
U.S. Pat. No. 3,296,581 issued to Warner on Jan. 3, 1967;
U.S. Pat. No. 4,032,847 issued to Unkauf on June 28, 1977.

The Warner patent discloses a circuit for deriving amplitude information from a signal transmitted over a transmission line which makes use of the fluctuation of the time period between zero crossing in the carrier signal due to noise.

The Farlow patent discloses a video slicer circuit which provides a noise free video output signal in response to a video input signal, irrespective of relatively wide variations in the noise level of the latter.

The Copeland et al patent discloses a circuit for eliminating ground clutter or noise from a received radar signal which discriminates between input pulses of different pulse widths and amplitudes.

The Krause, Levy and Unkauf patents are general background references each of which discloses a radio receiver for recovering intelligible information or data from a received signal that has been distorted during transmission.

While all of the above cited patent references are generally concerned with radio signals and the detection of the data information thereon, they are not directed particularly to the recovery of serial digital signals that have been distorted by long transmission lines. The present invention is directed toward a digital detection apparatus which is intended to satisfy that need.

SUMMARY OF THE INVENTION

The present invention utilizes a digital signal differencing circuit for recovery of a serial digital signal which is sent over a long transmission line and is distorted by the transmission line. Since the long transmission line distortion affects basically the pulse signal level, the only part of the received signal that can provide reliable timing information is the start of each voltage transition. The digital detection apparatus comprises a low pass filter, an analog delay line, a differential amplifier, and a hysteresis differential amplifier. The voltage hysteresis characteristics of the hysteresis differential amplifier provides an output digital signal which is based on each voltage transition of the received digital signal from a remote transmitter.

It is one object of the present invention therefore, to provide an improved digital pulse detection apparatus.

It is another object of the invention to provide an improved digital pulse detection apparatus.

It is yet another object of the invention to provide an improved digital pulse detection apparatus wherein the start of each voltage transition of the distored signal is utilized for timing information.

It is still another object of the invention to provide an improved digital pulse detection apparatus wherein the hysteresis characteristics of a hysteresis differential amplifier are utilized to provide a corrected digital signal.

It is yet another object of the invention to provide an improved digital pulse detection apparatus wherein high frequency reflections do not affect the measurements of the digital signal transitions.

These and other advantages, objects and features of the invention will become more apparent after considering the following description taken in conjunction with the illustrative embodiment in the accompanying drawings.

DETAILED DESCRIPTION OF THE PREFERRED EMBODIMENT

Figure 2:
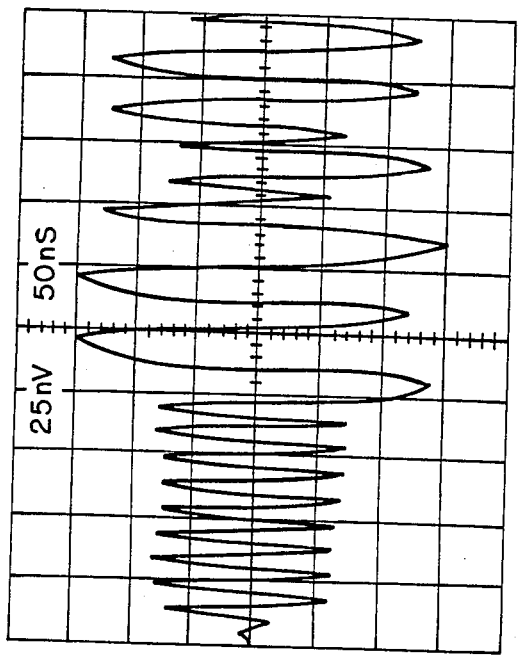
FIG. 2 is a graphical representation of a receiver stub signal when the transmitter is located relatively distant from the receiver.
Figure 1:
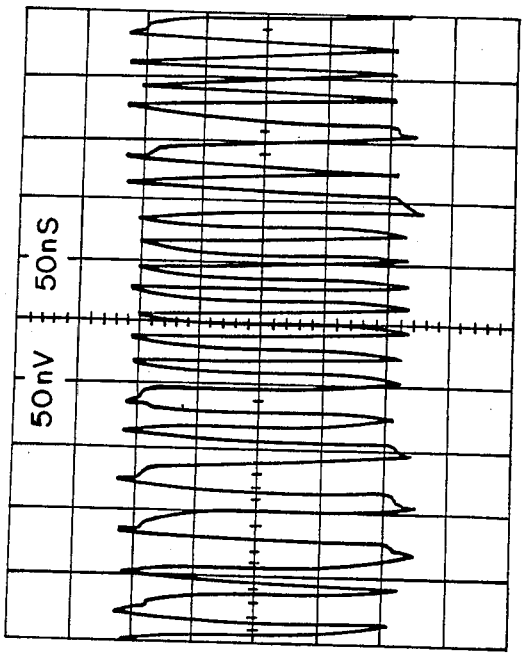
FIG. 1 is a graphical representation of a receiver stub signal when the transmitter is located relatively close to the receiver.

The present digital pulse detection apparatus provides the method and means for the accurate reconstruction of a digital pulse signal which has suffered a slight to large distortion in signal quality during the transmission process. In FIG. 1 there is shown a graphical representation of a transmitted digital pulse signal from a transmitter that is near the receiver. In FIG. 2 there is shown a graphical representation of a transmitted digital pulse signal from a distant transmitter. The start of a digital transition always travels down the transmission bus at the same speed but, due to the rise time of the transmission bus, the digital transition may not reach it's final value or level before the start of the next digital transition. The time difference between the digital transitions, the characteristics of the transmission line and the length of the transmission line, will determine if the digital transition reaches its final value. The only part of the received signal from a distant transmitter that will give reliable timing information is the start of each voltage transition. A simplified block diagram is shown in FIG. 3 that uses this technique and concept to recover the original transmitted signal.

Figure 3:
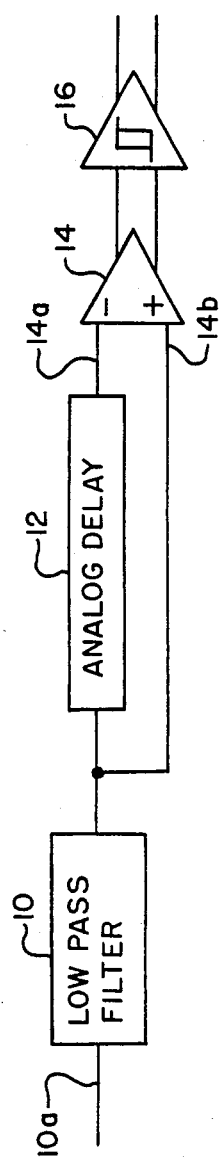
FIG. 3 is a block diagram of the digital pulse detection apparatus according to the present invention.

Referring now to FIG. 3, there is shown a block diagram of the digital pulse detection apparatus. A serial digital pulse signal which has been sent over a long transmission line, is applied to the input terminal 10a of the low pass filter unit 10. The low pass filter unit 10 is utilized to remove high frequency signal components from the input digital pulse signal. After filtering, the input digital pulse signal is simultaneously applied to the analog delay line unit 12 and to the non-inverting input 14b of the differential amplifier unit 14. The output signal from the delay line unit 12 which is a delayed digital signal, is applied to the inverting input 14a of the differential amplifier unit 14. If the input signal is represented by V(t) and the signal output of the delay line unit is represented by V(t-T), where t is the present time and T is the delay time for the time delay circuit, the differential output signal, $V_o$ of the differential amplifier is given by the equation:

$$V_o = K[V(t) - V(t-T)]$$

where K is the gain constant for differential amplifier unit 14. This signal $V_o$ is proportional to the difference between the present time t input signal and the signal present at time t-T. The differential output signal $V_o$ represents the delta derivative of the input signal which is a measure of the voltage slope in delta V/delta t. The differential output signal $V_o$ is applied to a differential amplifier unit 16 which has a voltage hysteresis that can be set to a desired value. This hysteresis value sets the minimum threshold voltage that will cause the hysteresis amplifier unit 16 to change states. The hysteresis differential amplifier unit 16 provides a corrected digital output signal. The low pass filter unit 10 removes some of the high frequency reflections that are due to connectors in the transmission line path between the receiver and the transmitter.

Figure 4:
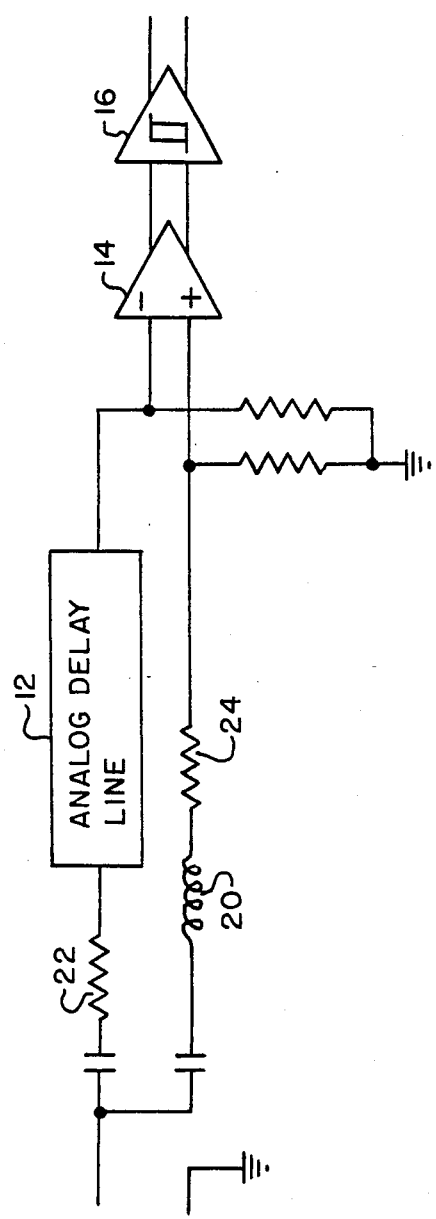
FIG. 4 is a block diagram of the digital pulse detection apparatus utilizing an inductor to provide a low pass filter function.
Figure 5:
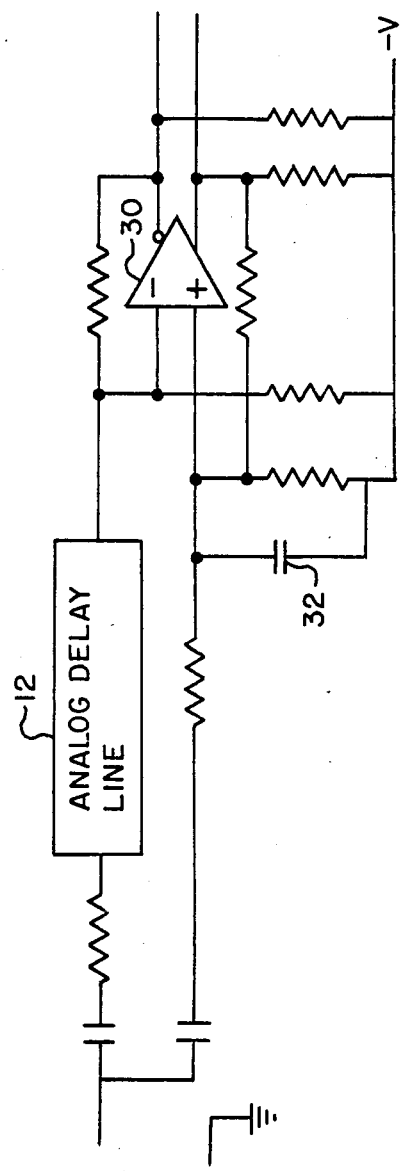
FIG. 5 is a block diagram of the digital pulse detection apparatus utilizing a capacitor to provide a low pass filter function.

Turning now to FIG. 4, there is shown the basic circuit of FIG. 3 except that an inductor 20 has been inserted into the input circuit to the non-inverting input of differential amplifier unit 14. The delay line unit 12 and the hysteresis differential amplifier unit 16 are the same units that were utilized in FIG. 3. The inductor 20 is added to the input circuit of the non-inverting input to the hysteresis differential amplifier unit 16 to give the undelayed signal from the transmitter the same rise time characteristics as the rise ti= =of the delayed signal from the delay line unit 12. This inductor 20 is required because the delay line unit 12 have a particular rise time characteristic. In addition, since the input digital signal is from a transmitter that is close the receiver, the input digital signal will most likely have a certain amount of overshoot as shown in FIG. 1. In order to compensate for the overshoot, the value of resistor 22 is made greater than the value of resistor 24 by a percentage equal to 2 times the expected overshoot. The combination of the rise time of the delay line and the rise time caused by the inductor 20 effectively function as the low pass filter which was shown in FIG. 3.

Where the input signal is of sufficient amplitude then the digital pulse detection apparatus may be simplified to the one shown in FIG. 5. In this apparatus the input signal and the delayed signal are applied to a differential amplifier unit 30 that has a set value of hysteresis. The delay line unit 12 is the unit as shown in FIGS. 3 and 4. However, in FIG. 5, a capacitor 32 is utilized on the non-inverting terminal of the differential amplifier unit 30 to make the rise time of the signal on the non-inverting terminal the same as the rise time of the signal through the delay line unit 12.

Although the invention has been described with reference to a particular embodiment, it will be understood to those skilled in the art that the invention is capable of a variety of alternative embodiments within the spirit and scope of the appended claims.

What is claimed is:

1. A digital pulse detection apparatus comprising in combination:
   a low pass filter receiving a digital signal, said low pass filter filtering said digital signal to remove high frequency components therefrom, said low pass filter providing a digital signal output,
   a delay unit operatively connected to said low pass filter unit to receive said digital output signal therefrom, said delay unit delaying said digital output signal by a predetermined time to provide a delayed digital signal,
   a first differential amplifier unit operatively connected respectively to said low pass filter and said delay unit, said first differential amplifier unit including inverting input and a non-inverting input, said delayed digital signal being applied to said inverting input, said digital signal output being applied to said non-inverting input, said first differential amplifier unit providing a differential output signal, which is defined by the equation, $V_o = K[V(t) - V(t-T)]$, where K is the gain constant for said first differential amplifier unit, V(t) is the present time t input signal, $V(t-T)$ is the signal present at time, $t-T$, and said differential output signal $V_o$ represents the delta derivative of the input signal which is a measure of the voltage slope in delta V/delta t, and,
   a second differential amplifier unit with a voltage hysteresis that may be set to a predetermined value, said second differential amplifier unit operatively connected to said first differential amplifier unit to receive said differential output signal therefrom, said second differential amplifier unit providing a corrected digital output signal.

2. A digital pulse detection apparatus as described in claim 1 wherein said low pass filter includes an inductor in series with said non-inverting input of said first differential amplifier unit.

3. A digital pulse detection apparatus as described in claim 1 wherein said low pass filter includes a capacitor coupled between said non-inverting input of said first differential amplifier and a negative biasing voltage.

4. A digital pulse detection apparatus as described in claim 1 wherein said digital signal comprises a series digital pulse signal.

5. A digital pulse detection apparatus as described in claim 1 wherein said delay unit comprises an analog delay line.

6. A digital pulse detection apparatus comprising in combination:
- a low pass filter receiving a digital signal, said low pass filter filtering said digital signal to remove high frequency components therefrom, said low pass filter providing a digital signal output,
- a delay unit operatively connected to said low pass filter unti to receive said digital output signal therefrom, said delay unit delaying said digital output signal by a predetermined time to provide a delayed digital signal, and,
- a high gain hysteresis differential amplifier unit operatively connected respectively to said low pass filter and said delay unit, said hysteresis differential amplifier unit including an inverting input and a non-inverting input, said delayed digital signal being applied to said inverting input, said digital signal output being applied to said non-inverting input, said hysteresis differential amplifier unit having a voltage hysteresis that may be set to a predetermined value, said hysteresis differential amplifier unti providing a corrected digital output signal.

* * * * *